United States Patent [19]

Kohlmüller et al.

[11] Patent Number: 4,559,165
[45] Date of Patent: Dec. 17, 1985

[54] TRANSPARENT CONDUCTING LAYER

[75] Inventors: Hans Kohlmüller; Waldemar Nippe, both of Erlangen, Fed. Rep. of Germany

[73] Assignee: Siemens Aktiengesellschaft, Munich, Fed. Rep. of Germany

[21] Appl. No.: 475,293

[22] Filed: Mar. 14, 1983

[30] Foreign Application Priority Data

Mar. 25, 1982 [DE] Fed. Rep. of Germany ....... 3211066

[51] Int. Cl.$^4$ ............................................. H01B 1/06
[52] U.S. Cl. ................................... 252/512; 252/513; 252/514; 252/518; 106/1.14; 106/1.15; 106/1.16; 350/357; 350/363
[58] Field of Search ............... 252/513, 514, 518, 512, 252/501.1, 408.1, 408 LC, 62.2; 350/357, 363; 340/785; 204/292; 429/218, 219, 220, 221, 223; 106/1.13, 1.14, 1.15

[56] References Cited

U.S. PATENT DOCUMENTS

| | | | |
|---|---|---|---|
| 4,113,507 | 9/1978 | McHenry et al. | 252/518 |
| 4,303,554 | 12/1981 | Sudo et al. | 252/518 |
| 4,345,000 | 8/1982 | Kawazoe et al. | 427/109 |
| 4,399,194 | 8/1983 | Zelez et al. | 428/457 |
| 4,420,500 | 12/1983 | Nakatani et al. | 252/518 |
| 4,490,024 | 12/1984 | de Wavens | 252/518 |
| 4,511,218 | 4/1985 | Fritz | 350/363 |

*Primary Examiner*—Josephine L. Barr
*Attorney, Agent, or Firm*—Kenyon & Kenyon

[57] ABSTRACT

The invention relates to a transparent display material having a conducting layer of a tin oxide and/or indium oxide composition which withstands electrochemical attacks without the need for elaborate measures. To this end, the invention provides that the conducting layer contains at least one metal of the Ib and/or eighth transition metal group with a content of from about $10^{-3}$ to 3% by weight, relative to tin oxide and/or indium oxide. The conducting layer according to the invention is particularly well suited for use in liquid-crystal displays.

2 Claims, No Drawings

TRANSPARENT CONDUCTING LAYER

BACKGROUND OF THE INVENTION

The invention relates to a transparent conducting layer using tin oxide and/or indium oxide, as well as a method for manufacturing such a conducting layer.

All kinds of passive displays such as electrochromic displays, electrolytic displays and liquid-crystal displays require transparent conducting electrodes, which purpose is in general served by glass provided with transparent conducting layers. The known conducting layers are predominantly made of tin oxide and/or indium oxide. In electrochromic and electrolytic displays, the display indication comes about by electrochemical reactions. The conducting layers can participate in these reactions and it is thereby possible to destroy the conducting layers. This can be done particularly by electrochemical reduction of the oxides contained in the conducting layers.

In field-effect liquid-crystal displays, an electric field causes the desired display indication. Accordingly, no detrimental reactions would be expected if liquid crystals were ideal insulators. However, since liquid crystals have a finite resistance, electrochemical reactions occur also in these displays. These reactions occur, within the displays, at the boundary surface electrode/liquid crystal. They moreover usually occur at the edges of the segments as a result of the high field strength producing disorientation of the edges and discoloration of all the transparent electrodes, caused by metallic tin or indium.

Outside the actual display device, a water film may be formed under unfavorable ambient conditions, and capillary condensation can occur particularly in cracks. Since the water film is conducting because of impurities in the air, this creates conditions for the occurrence of electrochemical reactions which can lead to the destruction of the conductors which consist of tin and/or indium oxide. These conductors which are connected to the individual segments and symbols of the display are required for driving.

The destruction of the conductors can occur in many kinds of displays. It has been attempted to delay this process or to suppress it altogether, particularly by using especially resistant materials. In addition, care is taken that there are no cracks in which capillary condensation can take place. However, all these measures are expensive and do not lead to the desired success. Another measure for preventing electrochemical reactions, namely, covering the conductors with a protective varnish is only partially possible because of the contacts which have to be made with the conductors. This preventive measure is therefore effective only to a limited degree.

Attempts have been made to prevent the destruction of the electrodes which takes place inside the display devices of liquid-crystal displays by using a sufficiently high driving frequency. These attempts, however, presuppose that the electrode reactions are reversible. These attempts utilize addition to the liquid crystals of small amounts of an oxidizable or reducible electron donor-acceptor complex (see German Offenlegungsschrift DE No. 30 42 517 Al, claim 1 or the corresponding U.S. patent application Ser. No. 318,613, of Nov. 5, 1981) or use liquid crystal components with electron donor-acceptor properties directly (see German Offenlegungsschrift DE No. 31 25 758 Al, claim 1). By the mentioned measures, the electrode polarization with the current given by ambient influences can be reduced, and thereby the prerequisite is created that the reaction at the electrodes caused by this current are reversible.

The mentioned measures are so effective that even d-c operation of liquid-crystal displays becomes feasible. If additives are used, it cannot be precluded entirely that an impairment of the liquid crystals can take place in certain individual cases. On the other hand, the choice of liquid crystals with electron donor-acceptor properties is still limited at the present time.

In electrochromic and electrolytic displays, methods to prevent the destruction of the electrodes have been studied which cover the electrode edges with a chemically inert layer (see U.S. Pat. No. 3,836,229). Such a measure is very expensive, however, from a production point of view.

It is, therefore, an object of the invention to develop a transparent display material having a conducting layer of a tin and/or indium oxide composition which withstands electrochemical attack and does not need elaborate measures such as those mentioned above.

SUMMARY OF THE INVENTION

These and other objects are achieved by the invention which is directed to a tin oxide and/or indium oxide composition display material which is resistant toward electrochemical reduction. According to the invention the resistive property is achieved by a conducting layer of a composition of tin oxide and/or indium oxide and at least one metal of the Ib and/or eighth transition metal group which is present in a concentration of from about $10^{-3}$ to 3 percent by weight, relative to the tin oxide and/or indium oxide.

DETAILED DESCRIPTION OF THE INVENTION

Through the incorporation of small amounts of at least one metal of the Ib and/or eighth transition metal group, the conducting layers according to the invention have increased stability, i.e., they are electrochemically resistant toward reduction. This applies to layers containing tin oxide as well as indium oxide and likewise to so-called ITO films, i.e., to films which have tin oxide as well as indium oxide. It is particularly advantageous that the conducting layers according to the invention are stable when they are very thin.

The stabilization is achieved by metals of the Ib and eighth transition metal groups of the periodic system of the elements. These are the elements copper, silver and gold (Ib transition metal group) and the elements iron, cobalt and nickel as well as the platinum metals, i.e. the elements ruthenium, rhodium, palladium, osmium, iridium and platinum (eighth transition metal group). The conducting films according to the invention have preferably a low platinum content.

The conducting layers according to the invention in which a metal such as platinum is embedded in a transparent layer of tin oxide and/or indium oxide, can serve as electrodes in electro-optical display devices; they are used particularly in liquid-crystal displays. Such electrodes are stabilized by the embedded metal and have the advantage that no expensive measures need to be taken, as would otherwise be customary, to prevent the destruction of the electrodes.

To prepare a conducting layer according to the invention, at least one metal of the Ib and/or eighth transition metal group is incorporated into the tin oxide or indium oxide. This can be done during the preparation of the conducting layer or after its completion. If the metal is already incorporated during the manufacturing process, the conducting film according to the invention can be prepared, for instance, by sputtering and a target can be used which contains the appropriate metal. It is thereby possible to place the amount of metal required for the stabilization into the conducting layer. Conducting films can further be prepared according to the so-called CVD ("chemical vapor deposition") method. Here, too, it is possible to incorporate the desired metal into the layer simultaneously.

If the metal is to be incorporated into a finished conducting layer, this can advantageously be done by electrolytic deposition of the metal, i.e., electrochemically. The metal is deposited preferably from very dilute solutions and in particular by means of a-c current; the current density is advantageously between about 0.01 and 0.1 mA/cm$^2$. If a-c current is used, the metal is incorporated directly throughout the conducting layer. If d-c current is used, a metal layer is first formed on the conducting layer, and subsequently the metal is then incorporated throughout the conducting layer, generally by annealing. However, the metal can also be deposited chemically, i.e., by reduction of a metal salt.

The conducting layer according to the invention can further be prepared in such a way that the metal is applied on the conducting layer as a thin film by sputtering and then incorporated through out in the layer by annealing. If, for example, conducting layers with a thickness of 300 nm are used, metal layers with a thickness of between 0.01 and 10 nm are generated by means of sputtering. The annealing process then takes place at about 300° C.

The invention will be explained in further detail with the aid of examples.

EXAMPLE

In liquid-crystal displays, the destruction of the conducting films is triggered by quasi-galvanostatic processes, because the current flowing through the cell is limited primarily by high resistance films (within the display: liquid crystals; outside the display; water films) and the driving voltage. Since the driving voltage is large as compared to the electrode polarization and the resistance of the layers limiting the current (liquid crystals and water films, respectively) is approximately constant, a constant current can be assumed as responsible for the destruction of the conducting layers. This actuation is taken into consideration by the following measuring setup.

In a cell with a reference and a counter-electrode, a glass plate provided with a conducting indium oxide/tin oxide layer (ITO layer) is disposed as the working electrode The electrolyte is 1 mol KCl (in water). The use of an aqueous potassium chloride solution as the electrolyte allows the employment of an Ag/AgCl electrode of very simple design as the reference electrode. The counterelectrode consists of a platinized platinum sheet.

The counterelectrode and the working electrode are connected to a voltage source. The current flowing through the cell is limited by a resistor R between the voltage source and the counterelectrode. By means of a step switch, the resistor R can be varied between 1 kohm and 100 kohm. Due to the relatively high driving voltage of 30 V pp (at 1 Hz), the current flowing through the cell is approximately constant. "V pp" means the voltage (in the case of a-c current) between two peaks: 30 Vpp corresponds to approximately 10 V a-c voltage.

The a-c voltage between the reference electrode and the working electrode is rectified by a diode and smoothed via a capacitor (C=10 uF) and then recorded by means of a recorder. The voltage between the ITO layer, i.e., the working electrode (area: about 2 cm$^2$) and the reference electrode rises to about the value of the driving voltage if the conducting layer is destroyed. For, when the conducting layer is destroyed, its resistance becomes very high (up to infinity), so that the voltage at the capacitor becomes equal to the driving voltage.

In the procedure explained, which is also called stress test, the rise of the voltage at the capacitor is therefore considered to be an indication of the end of the service life (life time) of the display. At the end of the life time, the conducting layers also have usually a metal film which influences transmission. In general, the stress test is carried out with a squarewave voltage of 30 V pp and 1 Hz and a resistance of 3 kohm. For particularly stable layers, this test can be made more stringent. In this modification, a resistance of 1 kohm is used instead of a resistance of 3 kohm. In most situations, this change in resistance has a more than proportional effect; a shortening of the life in the range of one order of magnitude (factor 10) is brought about.

According to the invention, platinum was incorporated into an (unpretreated) ITO layer. For this purpose the ITO layer was arranged together with a counter electrode in a cell; electrolyte: 1 mol KCl+10$^{-4}$ mol H$_2$PtCl$_6$ (in water). The platinum was precipitated by means of squarewave current (1 Hz, 0.1 mA/cm$^2$); duration: 2 hours. The conducting layer doped with platinum showed no changes with respect to transparency.

In the stress test, the untreated conducting layer, i.e., without platinum, had a life time of about 20 sec. In comparison thereto, the life time of the platinum-doped conductive layer was increased to more than 10,000 sec; i.e., this film was practically indestructible in the (normal) stress test.

The fact that a noticeable stabilization was caused by very small amounts of platinum is demonstrated by the following. If the precipitation time under the foregoing conditions was only 2 minutes, the life time was increased in the stress test by a factor of 10.

The effect of metal concentration was shown by depositing various thicknesses of platinum on the foregoing conducting layer (ITO) and then annealing. Using a sputtering apparatus (deposition rate for a distance of 3 cm: 10 nm/min; minimum sputtering time: 15 sec), thin metal layers were applied to untreated ITO films. Conducting layers were provided with the following films:

Sample 1: 2 nm Pt (sputtering time: 15 sec, distance: 3 cm);

Sample 2: 3 nm Pt (sputtering time: 20 sec, distance: 3 cm);

Sample 3: 0.5 nm Pt (sputtering time: 15 sec, distance; 6 cm). The samples were subsequently annealed at 300° C.

While the life time of untreated samples (no metal incorporated) in normal stress test was about 20 sec, sample 3 had a life time of 500 sec. Samples 1 and 2 showed a life time of more than 1000 sec in the more stringent stress test.

What is claimed is:

1. A transparent display material which is resistant toward electrochemical reduction, which comprises a conducting layer composition of tin oxide or indium oxide or a mixture thereof and at least one metal selected from copper, silver, gold, iron, cobalt, nickel, ruthenium, rhodium, palladium, osmium, iridium and platinum or a mixture thereof at a concentration from about $10^{-3}$ to 3 percent by weight relative to the tin oxide and/or indium oxide.

2. A transparent display material according to claim 1 wherein the metal is platinum.

* * * * *